United States Patent

Owens

[15] 3,641,474

[45] Feb. 8, 1972

[54] SEMICONDUCTOR MOUNTING STRUCTURE

[72] Inventor: Raymond Clyde Owens, Carmel, Ind.

[73] Assignee: RCA Corporation

[22] Filed: May 11, 1970

[21] Appl. No.: 36,057

[52] U.S. Cl. ........................339/17 L, 174/68.5, 317/100 R, 317/101 D, 317/234 R, 339/92 R, 339/112 R, 339/125 R

[51] Int. Cl. ........................................H02b 1/02, H05k 1/02

[58] Field of Search ............339/119 R, 125 R, 132 R, 132 B, 339/134, 17, 176 MP, 112 R, 92 R, 92 M; 317/234.4, 234 R, 100 R, 101 C, 101 CC, 101 D

[56] References Cited

UNITED STATES PATENTS

| | | | |
|---|---|---|---|
| 2,744,214 | 5/1956 | Di Marco | 339/17 M X |
| 2,905,920 | 9/1959 | Lutton | 339/17 N |
| 2,977,512 | 3/1961 | Sinner | 339/17 C X |
| 3,164,750 | 1/1965 | Miller | 339/112 R X |
| 3,404,362 | 10/1968 | Amendola | 339/17 LC |
| 3,465,212 | 9/1969 | Grimes et al. | 317/100 X |
| 3,475,657 | 10/1969 | Knowles | 339/176 MP |
| 3,522,490 | 8/1970 | Kauffman | 317/234 G |

FOREIGN PATENTS OR APPLICATIONS

| | | | |
|---|---|---|---|
| 1,521,210 | 3/1968 | France | 339/17 LC |

*Primary Examiner*—Marvin A. Champion
*Assistant Examiner*—Terrell P. Lewis
*Attorney*—Eugene M. Whitacre

[57] ABSTRACT

The electrode leads extending from the body of a capsule enclosing a heat-generating semiconductor device are plugged into a connector socket affixed to a circuit board and the mounting tab of the capsule is connected by a screw in good heat-conducting contact to a heat-dissipating metal plate attached to the circuit board, the capsule being prevented from moving laterally when the screw is tightened by two spaced blocks positioned on the metal plate at the sides of the capsule body.

8 Claims, 3 Drawing Figures

PATENTED FEB 8 1972

3,641,474

INVENTOR.

Raymond C. Owens

BY Harold W. Reick

ATTORNEY

SEMICONDUCTOR MOUNTING STRUCTURE

In the manufacture of electronic instruments, such as radio and television receivers for example, semiconductor devices including power transistors frequently are used in some circuits, such as the voltage regulator and vertical deflection output stages of a television receiver. Such semiconductor devices generate considerable heat which must be dissipated in order for them to function properly. It, therefore, has been customary to mount these devices on what commonly is called a "heat sink" which generally is a metal structure having the property of relatively rapid heat dissipation. A class of power transistor that presently is used rather extensively in electronic instruments and the like is a molded plastic type, also referred to as a molded flat pack. Such a semiconductor device is enclosed in a capsule from one side of the body portion of which the electrode leads protrude. It also has an apertured mounting tab extending from the side of the capsule body opposite to that from which the leads protrude.

Conventionally, semiconductor devices of this character have been hand wired and mounted on a metal plate, serving as a heat sink, by threading a screw through the apertured mounting tab into the plate. The hand wiring of these devices is a laborious and time-consuming operation which is not well suited to being performed on an assembly line, particularly where the devices are to be connected to printed circuit boards that are preferred for use in many electronic instruments. Also it has been found that, when the mounting screw is tightened against the mounting tab of the capsule containing the semiconductor device, the entire capsule often turns, causing the protruding electrode leads to become twisted and short circuits to be produced. Furthermore, it is difficult to service an instrument with such a prior art semiconductor mounting and connection in that a soldering operation is required for the replacement of a defective device and care must be exercised in tightening the mounting screw to avoid twisting and short circuiting of the electrode leads.

It, therefore, is an object of this invention to provide an improved structure for mounting a heat-generating semiconductor device in which (1) soldering operations are unnecessary for connecting the device to its associated circuit, for example on a printed circuit board, and (2) attachment to a heat sink does not damage the device and/or its electrode leads.

In accordance with the invention, the mounting structure for a capsule containing a heat-generating semiconductor device and having apertured mounting means and protruding leads from the electrodes of the semiconductor includes a connector socket affixed to one side of an insulating circuit board with female type conducting receptacles adapted to receive the electrode leads and having terminals from the receptacles extending through the circuit board. A heat-dissipating metal plate, having an anchor hole adapted to receive an anchoring screw through the aperture of the capsule mounting means, is attached in such relation to the circuit board that the semiconductor electrode leads may be inserted in the connector socket receptacles and the capsule held in firm heat-conducting contact with the plate by the anchoring screw. A feature of the invention is that, when the semiconductor capsule is of the type having an apertured tab as its mounting means, the metal heat-dissipating plate is provided with two spaced blocks positioned on opposite sides of the capsule body to prevent any substantial lateral movement of the capsule when the anchoring screw is tightened.

For a more specific disclosure of the invention reference may be had to the following detailed description of an illustrative embodiment thereof which is given in conjunction with the accompanying drawing, of which:

Figure 1:
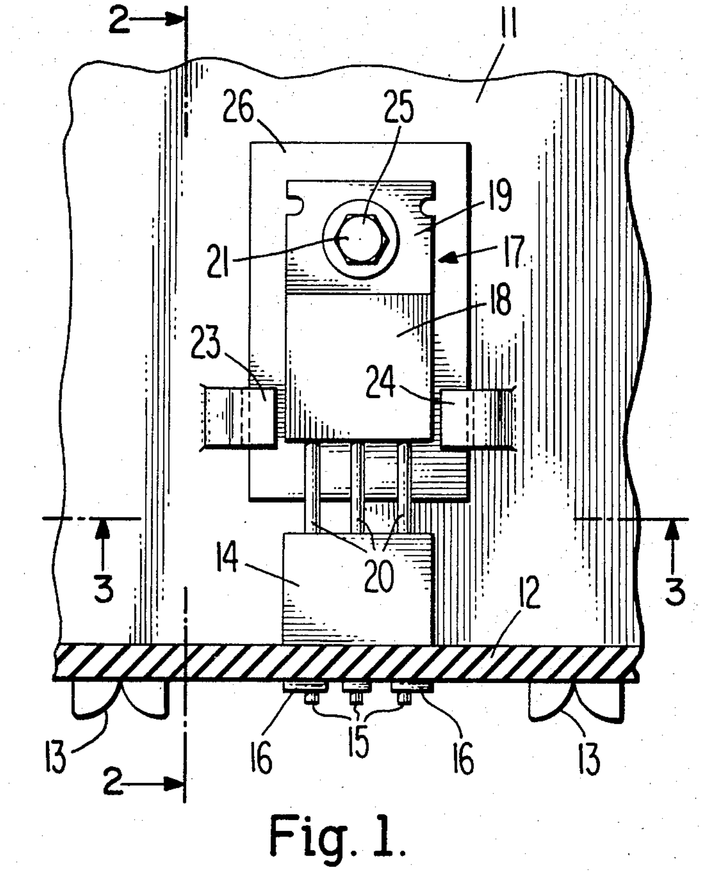
FIG. 1 is an elevational view of the semiconductor mounting structure of the invention.
Figure 2:
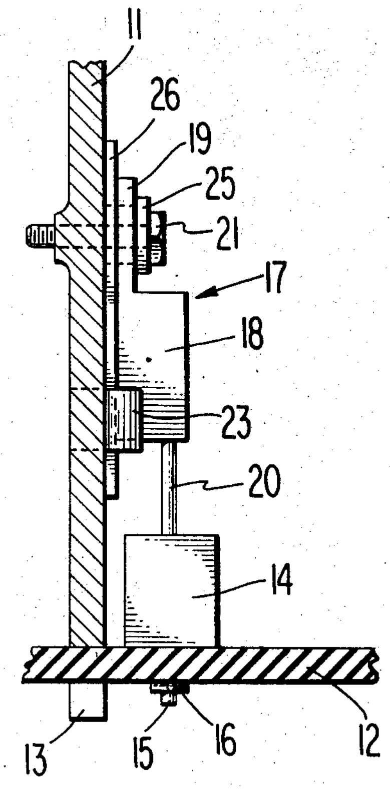
FIG. 2 is a sectional view of the mounting taken on the line 2—2 of FIG. 1.

In the drawing, a metal plate 11, which is a good dissipator of heat is mounted on the top side of, and perpendicularly to, an insulating printed circuit board 12 by means of stakes 13 extending from the bottom edge of the plate through the circuit board and clinched on the bottom side of the board. The plate 11 may be an especially provided semiconductor heat sink or it may be a part of the chassis or other metal structure of an electronic instrument which serves both as a mounting for instrument components, such as the circuit board 12, and as a heat sink for semiconductor devices and other heat-generating apparatus. A connector socket 14, having at its top side conventional female type conducting receptacles (not shown), is affixed to the upper surface of the circuit board 12 and has terminals 15 electrically connected respectively to the receptacles and extending through the circuit board for connection with the circuits 16 printed thereon.

A molded plastic type of power transistor is encased in a capsule 17 having a body portion 18 and a mounting tab 19 extending from one end of the body 18. Leads 20 extend from the electrodes of the transistor through the other end of the capsule body 18 and are inserted into the respective receptacles of the connector socket 14.

The mounting tab 19 of the transistor capsule 17 has a hole through which an anchoring screw 21 is passed and threaded into an anchor hole in the plate 11. The anchor hole in the plate may conveniently be an extrusion 22 and the anchoring screw 21 may be of the self-tapping variety.

Figure 3:
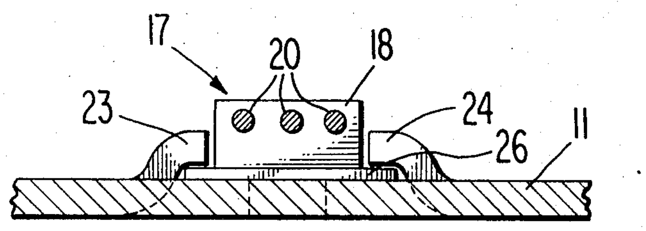
FIG. 3 is another sectional view of the mounting taken on the line 3—3 of FIG. 1.

Two spaced restraining blocks 23 and 24 are adjacent, and on opposite sides of, the capsule body 18 so that, after the leads 20 have been inserted into the receptacles of the connector socket 14 and the anchoring screw 21 is tightened into the anchor hole 22 to effect a good heat-conducting contact between the capsule 17 and the plate 11, any tendency for the capsule to turn or move laterally is prevented. As a matter of convenience, the blocks 23 and 24 may be stamped or extruded from the plate 11 as best shown in FIG. 3.

If needed in a particular application of the invention, the anchoring screw 21 may be electrically isolated from the capsule 17 by means of an insulating bushing 25 of nylon or the like material. Also, where necessary, a thin sheet 26 of mica or the like insulation may be placed between the transistor capsule 17 and the metal plate 11.

The semiconductor mounting structure provided by this invention is well adapted for assembly line manufacture of electronic instruments, such as radio and television receivers for example. It requires only seconds to plug the electrode leads 20 of the semiconductor device contained in the capsule 17 into the connector socket 14 and then to insert the anchoring screw 21 through the apertured mounting tab 26 and tighten it in the anchor hole 22 of the heat sink plate 11. The time required for the mounting and connecting operation is not significantly longer when the insulating bushing 25 and the dielectric sheet 26 are included in the assembly. Servicing of an instrument equipped with such a mounting structure for the heat-generating semiconductor devices also is materially easier than those with mounting structures of the prior art because there is no soldering required and the danger of twisting and short circuiting of the electrode leads is eliminated.

Although the mounting structure embodying the invention has been disclosed herein with a three-electrode transistor of a particular type, it is to be understood that its use is not necessarily so limited. On the contrary, it may also be used advantageously with other types of transistors, semiconductor diodes, silicon controlled rectifiers and the like. The improved mounting structure of the invention should, therefore, be limited only as specified in the following claims.

What is claimed is:

1. A mounting structure for a capsule containing a heat-generating semiconductor, said capsule having apertured mounting means and leads protruding from the electrodes of said semiconductor, said structure comprising:

a circuit board of insulating material, a plug-in connector socket affixed to one side of said circuit board, with terminals extending through said board, and having a plurality of receptacles adapted to receive said respective semiconductor electrode leads; and a heat-dissipating metal plate having an anchor hole adapted to receive an anchoring screw through the mounting means aperture of said capsule, said metal plate further having first and second restraining members spaced on opposite sides of said anchor hole and positioned to engage the body portion of said capsule so as to prevent lateral movement of said capsule when said anchoring screw is tightened, said plate and said circuit board being attached to one another in a substantially perpendicular relation such that said capsule, with its semiconductor electrode leads inserted into said connector socket and said anchoring screw tightened, is held in firm heat-conducting contact with said metal plate.

2. A semiconductor capsule-mounting structure as defined in claim 1, wherein:

said mounting means comprises an apertured tab extending from the semiconductor-containing body portion of said capsule.

3. A semiconductor capsule-mounting structure as defined in claim 2, wherein:

said two spaced restraining members are positioned on opposite sides of the body portion of said capsule and extend over the edges of said capsule to support said capsule against said plate and to prevent lateral movement of said capsule when said anchoring screw is tightened.

4. A semiconductor capsule-mounting structure as defined in claim 3, wherein:

said restraining blocks are extruded from said metal plate.

5. A semiconductor capsule-mounting structure as defined in claim 4, wherein:

said anchor hole is extruded from said plate; and said anchoring screw is self-tapping.

6. A mounting structure for a capsule containing a heat-generating semiconductor, said capsule having leads protruding from the electrodes of said semiconductor and apertured mounting means comprising an apertured tab extending from the semiconductor-containing body portion of said capsule, said structure comprising:

a circuit board of insulating material;

a heat-dissipating metal plate attached in substantially perpendicular relation to said circuit board, said plate having an anchor hole adapted to receive an anchoring screw through the mounting means aperture of said capsule, and two spaced restraining blocks positioned on opposite sides of the body portion of said capsule to prevent lateral movement of said capsule when said anchoring screw is tightened;

a connector socket affixed to one side of said circuit board, with terminals extending through said board, and having a plurality of receptacles substantially parallel to said metal plate adapted to receive said respective semiconductor electrode leads; wherein said semiconductor electrode leads protrude from the body portion of said capsule substantially parallel to said capsule-mounting tab and said metal plate; and said plate and said circuit board are attached to each other in such relation that said capsule, with its semiconductor electrode leads inserted into said connector and said anchor screw tightened, is held in firm heat-conducting contact with said metal plate.

7. A semiconductor capsule-mounting structure as defined in claim 6, wherein:

said mounting tab aperture is provided with an insulating bushing to electrically isolate said anchoring screw from said capsule.

8. A semiconductor capsule-mounting structure as defined in claim 7, wherein:

a thin sheet of heat-conducting, electrically insulating material is inserted between said capsule and said metal plate.

* * * * *